United States Patent
Qi et al.

(10) Patent No.: US 10,216,701 B2
(45) Date of Patent: Feb. 26, 2019

(54) IMAGE-BASED POINT-SPREAD-FUNCTION MODELLING IN TIME-OF-FLIGHT POSITRON-EMISSION-TOMOGRAPHY ITERATIVE LIST-MODE RECONSTRUCTION

(71) Applicants: THE REGENTS OF THE UNIVERSITY OF CALIFORNIA, Oakland, CA (US); TOSHIBA MEDICAL SYSTEMS CORPORATION, Otawara-shi (JP)

(72) Inventors: Jinyi Qi, Davis, CA (US); Jian Zhou, Davis, CA (US); Hongwei Ye, Kenosha, WI (US); Wenli Wang, Briarcliff Manor, NY (US)

(73) Assignees: The Regents of the University of California, Oakland, CA (US); TOSHIBA MEDICAL SYSTEMS CORPORATION, Otawara-shi (JP)

( * ) Notice: Subject to any disclaimer, the term of this patent is extended or adjusted under 35 U.S.C. 154(b) by 252 days.

(21) Appl. No.: 14/668,001

(22) Filed: Mar. 25, 2015

(65) Prior Publication Data
US 2015/0199302 A1    Jul. 16, 2015

Related U.S. Application Data

(63) Continuation of application No. PCT/US2013/066598, filed on Oct. 24, 2013.
(Continued)

(51) Int. Cl.
*G06F 17/10* (2006.01)
*G06F 17/16* (2006.01)
(Continued)

(52) U.S. Cl.
CPC .......... *G06F 17/16* (2013.01); *G06F 17/5009* (2013.01); *G06T 11/006* (2013.01); *G06T 2211/416* (2013.01); *G06T 2211/424* (2013.01)

(58) Field of Classification Search
CPC ...................................................... G06F 17/16
(Continued)

(56) References Cited

U.S. PATENT DOCUMENTS

| 2009/0110256 A1 | 4/2009 | Thielemans et al. |
| 2010/0111370 A1 | 5/2010 | Black et al. |

(Continued)

OTHER PUBLICATIONS

Jinyi Qi, et al., "High Resolution 3D Bayesian Image Reconstruction using the microPET Small Animal Scanner" Signal and Image Processing Institute, University of Southern California; Imaging Sciences Division, Crump Institute for Biological Imaging, UCLA School of Medicine, Oct. 17, 1997, pp. 1-17.

(Continued)

*Primary Examiner* — Hugh M Jones
(74) *Attorney, Agent, or Firm* — Oblon, McClelland, Maier & Neustadt, L.L.P.

(57) ABSTRACT

A method of calculating a system matrix for time-of-flight (TOF) list-mode reconstruction of positron-emission tomography (PET) images, the method including determining a TOF geometric projection matrix G including effects of object attenuation; estimating an image-blurring matrix R in image space; obtaining a diagonal matrix D that includes TOF-based normalization factor; and calculating the system matrix H as H=DGR.

13 Claims, 4 Drawing Sheets

Related U.S. Application Data

(60) Provisional application No. 61/719,055, filed on Oct. 26, 2012.

(51) Int. Cl.
 *G06T 11/00* (2006.01)
 *G06F 17/50* (2006.01)

(58) Field of Classification Search
 USPC .............................................................. 703/2
 See application file for complete search history.

(56) References Cited

U.S. PATENT DOCUMENTS

| | | |
|---|---|---|
| 2011/0044524 A1 | 2/2011 | Wang et al. |
| 2012/0089015 A1 | 4/2012 | Gagnon et al. |

OTHER PUBLICATIONS

Vladimir Y. Panin, et al., "Fully 3-D PET Reconstruction With System Matrix Derived From Point Source Measurements" IEEE Transactions on Medical Imaging, http://www.researchgate.net/publication/6958817, available from Christian Jean Michel, vol. 25, No. 7, Jul. 2006, Retrieved on Jun. 24, 2015, 16 Pages.

Bin Zhang, et al., "PET image resolution recovery using PSF-based ML-EM deconvolution with blob-based list-mode TOF reconstruction" Journal of Nuclear Medicine, http://jnm.snmjournals.org, vol. 52, No. supplement 1 266, May 2011, Retrieved on Sep. 30, 2015, 1 Page.

Jingyu Cui, et al., "Measurement-Based Spatially-Varying Point Spread Function for List-Mode PET Reconstruction on GPU" IEEE Nuclear Science Symposium Conference Record, 2011, pp. 2593-2596.

Adam M. Alessio, et al., "Application and Evaluation of a Measured Spatially Variant System Model for PET Image Reconstruction" NIH Public Access Author Manuscript, IEEE Trans Med Imaging, Mar. 2011, 37 Pages.

Hongwei Ye, et al., "Improved List-Mode Reconstruction with an Area-Simulating—Volume Projector in 3D Pet" IEEE Nuclear Science Symposium and Medical Imaging Conference Record , 2012, pp. 3311-3314.

International Search Report dated Mar. 21, 2014, for PCT/US2013/066598 filed on Oct. 24, 2013, 1 pg.

Written Opinion of the International Searching Authority dated Mar. 21, 2014 for PCT/US2013/066598 filed on Oct. 24, 2013, 3 pp.

IMAGE-BASED POINT-SPREAD-FUNCTION MODELLING IN TIME-OF-FLIGHT POSITRON-EMISSION-TOMOGRAPHY ITERATIVE LIST-MODE RECONSTRUCTION

CROSS-REFERENCE TO RELATED APPLICATIONS

The present application is a continuation application of International Application No. PCT/US2013/066598, filed Oct. 24, 2013, which claims priority under 35 U.S.C. § 119(a) to Provisional Application No. 61/719,055 filed Oct. 26, 2012, which is incorporated herein by reference.

STATEMENT OF GOVERNMENT RIGHTS

This invention was made with government support under the contract 5R01EB000194-09 awarded by the National Institute of Health (NIH). The government has certain rights in the invention.

FIELD

Embodiments described herein relate generally to reconstruction methods for list mode time-of-flight (TOF) positron emission tomography (PET) systems.

BACKGROUND

Positron emission tomography is a branch of nuclear medicine in which a positron-emitting radiopharmaceutical is introduced into the body of a patient. As the radiopharmaceutical decays, positrons are generated. More specifically, each of a plurality of positrons reacts with an electron in what is known as a positron annihilation event, thereby generating a pair of coincident gamma photons which travel substantially in opposite directions along a line of coincidence. A gamma photon pair detected within a coincidence interval is ordinarily recorded by the PET scanner as an annihilation event.

In TOF PET imaging, the time within the coincidence interval at which each gamma photon in the coincident pair is detected is also measured. The time-of-flight information provides an indication of the annihilation location of the detected event along the line of coincidence. Data from a plurality of annihilation events is used to reconstruct or create images of the patient or object scanned, typically by using statistical (iterative) or analytical reconstruction algorithms.

TOF PET has become the state of the art for clinical PET imaging. The list-mode-based iterative reconstruction technique is the most popular choice of image reconstruction algorithms for TOF PET due to its capability of using an accurate system model and thus improving the image quality. To avoid the storage of a huge system matrix, list-mode reconstruction can calculate lines of response (LOR) on-the-fly. However, the accuracy of the on-the-fly calculation is limited due to the constraint on image reconstruction time. This has led to a major use of parallel computing techniques such as distributed computing and the use of graphics processing units (GPUs) to help accelerate the processing speed. On the other hand, for better reconstruction, accurate LORs are necessary to model detector physical response, which still can cause a big computational overhead during the on-the-fly calculation, even with GPU acceleration.

Alternatively, one can use a factorized system model to replace the accurate system model without significant performance degradation. A typical factorized system model may have three major components: a detector blurring matrix, a geometrical projection matrix and an image blurring matrix. The geometrical projection matrix provides the mapping from the image space to the projection space. Unlike the accurate system matrix, it might only contain simple pure geometrical LORs, which often have much fewer nonzero elements, and hence is more suited to the on-the-fly calculation. An often-used projector includes the Siddon's raytracer, which performs the line integral along the line segment defined by a pair of crystals.

A detector blurring matrix can be used along with the geometrical projection matrix to form a complete factorized model. Such factorization has been widely adapted with various detector blurring matrices estimated using either Monte Carlo simulations or real point source scans. However, because the detector blurring requires data in the neighboring projection bins, it is not compatible with the list mode data.

An area-simulating-volume (ASV) TOF-OSEM reconstruction algorithm for PET calculates the overlapping area between the tube-of-response (TOR) and an image voxel as the product of two distance ratios in the X-Y plane and Y-Z (or X-Z) plane, and applies this area as the geometric probability in the system matrix. This reconstruction algorithm has been shown to be very close to a full system matrix modeling in terms of lesion contrast recovery and background noise. However, it does not model extra detector response due to photon pair non-colinearity and crystal penetration, and thus does not have sufficient image resolution recovery.

To reduce TOF-PET data size and preserve spatial accuracy of measured coincidence event, list-mode instead of sinogram reconstruction has been used. In list-mode reconstruction, each individual event is processed one at a time. In this case, a PSF kernel modeled in projection space is not convenient to implement, since its neighboring bins are not readily available.

DRAWINGS

A more complete appreciation of the disclosed embodiments and many of the attendant advantages thereof will be readily obtained as the same becomes better understood by reference to the following detailed description when considered in connection with the accompanying drawings, wherein.

Figure 2A:
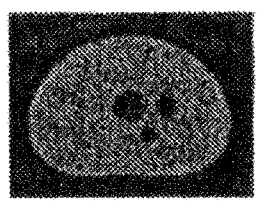
Figure 2B:
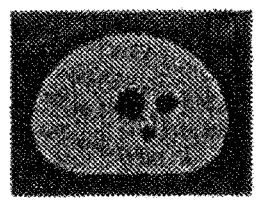
Figure 2C:
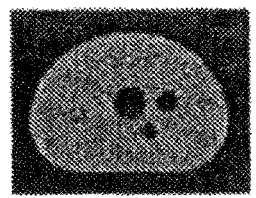
Figure 3:
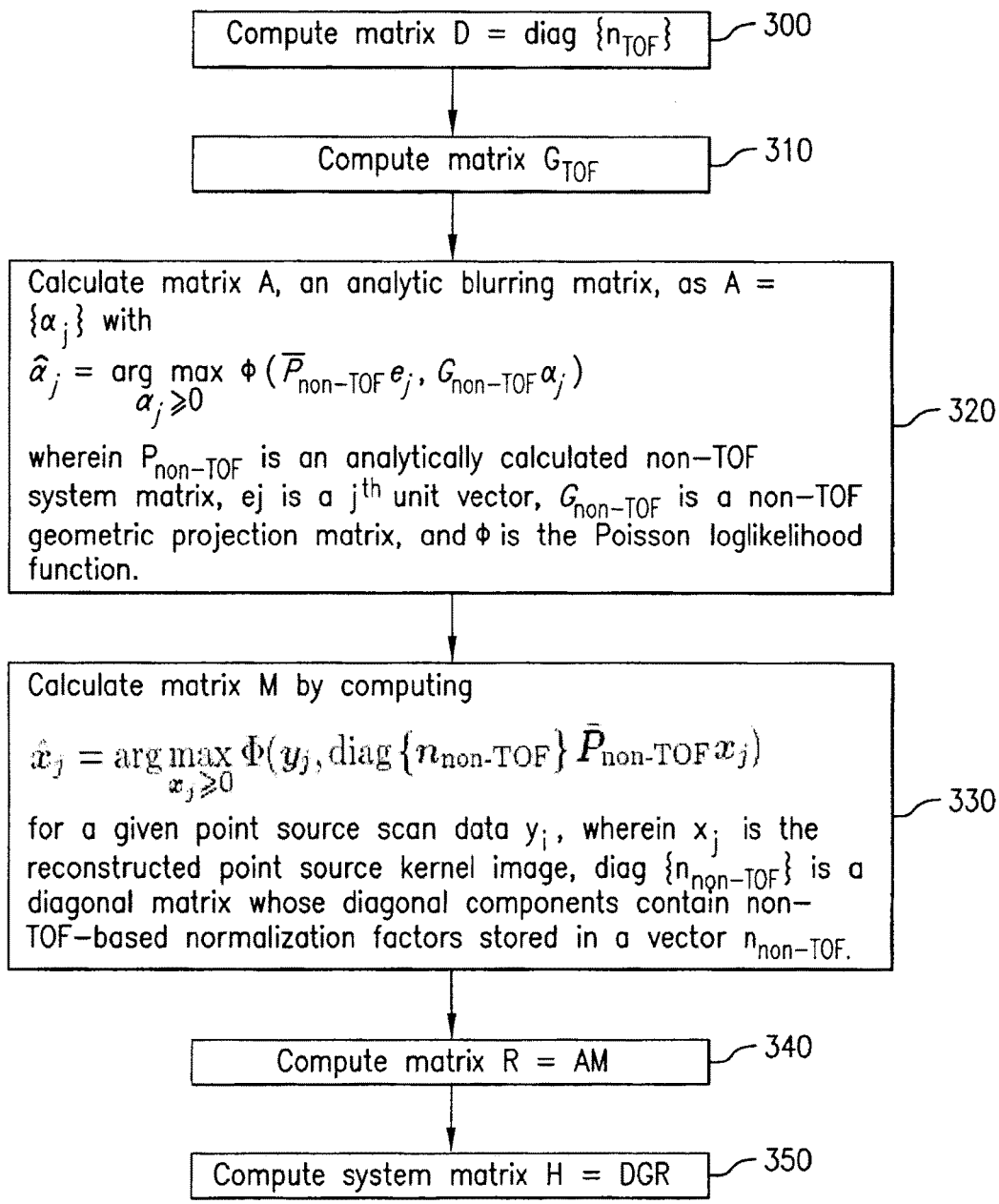
Figure 4:
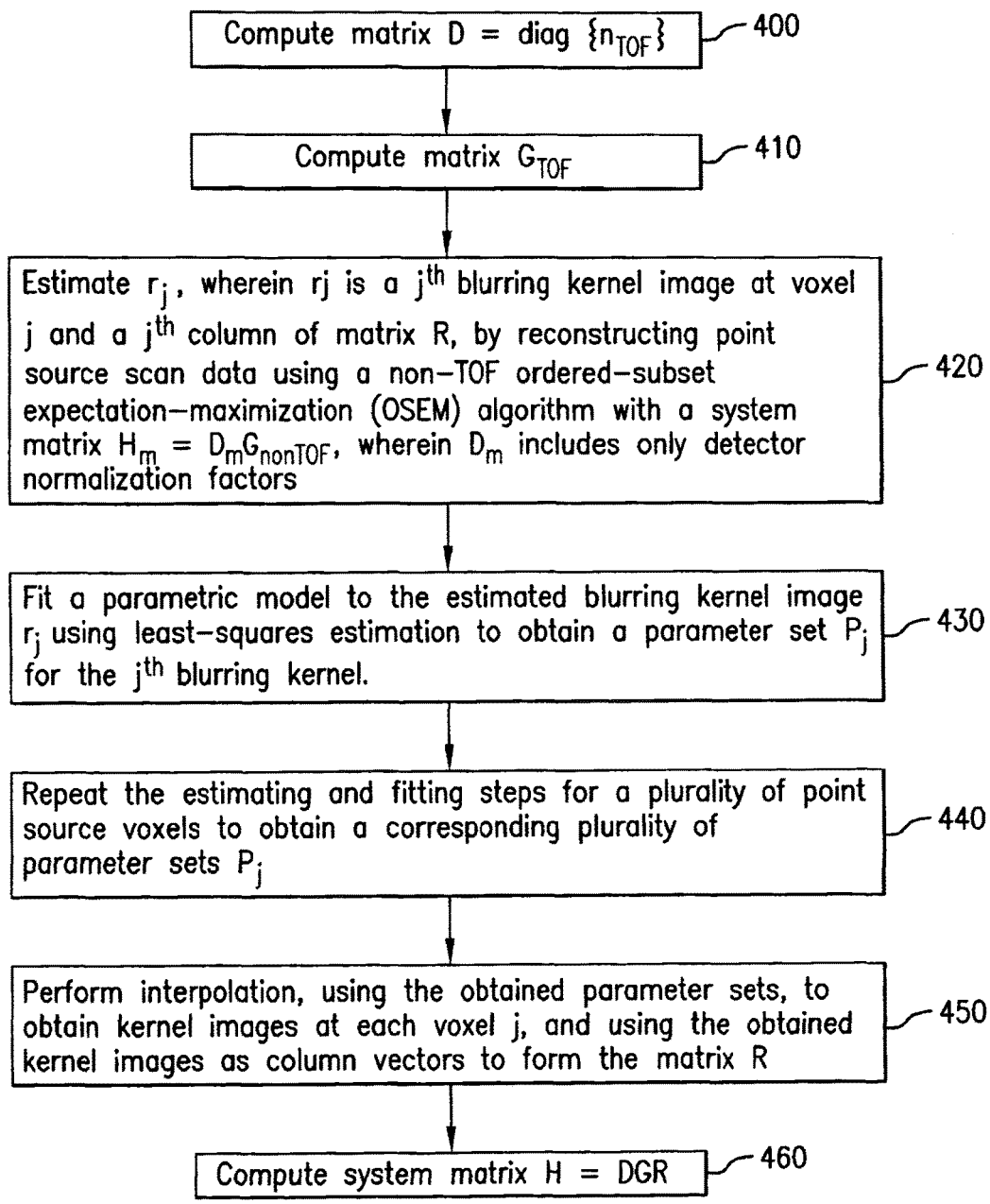
Figure 5:
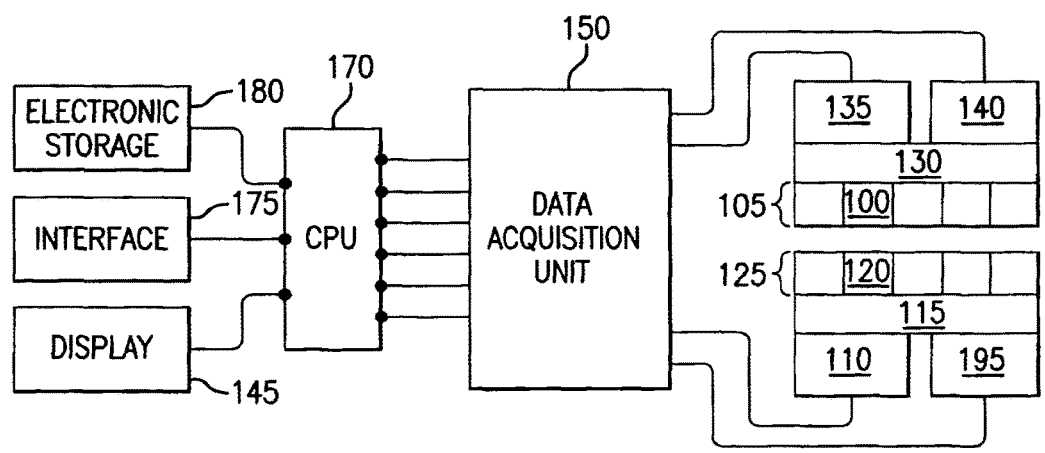

FIGS. 2(a)-2(c) illustrate a comparison of TOF image reconstruction using different resolution models, wherein images were obtained with 5 iterations and 20 subsets;

FIG. 3 illustrates a method of computing a system matrix according to one embodiment;

FIG. 4 illustrates a method of computing a system matrix according to another embodiment; and FIG. 5 illustrates a PET hardware configuration to implement the disclosed embodiments.

DETAILED DESCRIPTION

Rather than the use of a detector blurring matrix, an image blurring matrix can also work with the geometrical projection matrix to create another factorized model. This image-based factorization model does not require the detector blurring operation and hence works for the list mode data in a straightforward manner. The image burring kernels can be customized for a particular choice of geometrical projection matrix. Therefore, it is extremely useful when the image blurring matrix is combined with an aforementioned simple geometrical projection matrix. In such a case, the blurring kernels not only suppress the noise from the observed data, but also correct the LOR sampling aliasing artifacts. Since an image blurring matrix that forms an exact factorization is generally hard to obtain, the image-based factorization model can only serve as an approximation to the non-factorization model. Therefore, it is important to understand how the "built-in" factorization error impacts the reconstruction accuracy.

In the embodiments disclosed herein, a hybrid model that combines analytical calculation and measured data is presented. More specifically, the factored system model disclosed herein includes three major components: a geometrical projection matrix, an image blurring matrix derived from analytical calculation, and an image blurring kernel based on measured data. In order to accelerate projection speed, the geometrical projection is performed on-the-fly by using a simple line integral-based LOR model. The analytical image blurring kernel is estimated for every voxel location independently and can compensate for the blurring effect caused by crystal penetration and finite crystal width. It can also compensate for spatially variant sampling artifacts caused by the simple line integral model, because spatial smoothness and rotational symmetry are not assumed. The measurement-based image blurring kernel is used to model the blurring effect caused by inter-crystal scatter and crystal mis-positioning caused by electronic noise. Rotational symmetry and smoothness constraints are imposed on the measurement-based kernels so that a point source need only be scanned at a few positions. The combination of the analytical and measurement-based image blurring kernels allows for accurate modeling of the spatially variant response with a small number of point source scans.

In particular, in one embodiment, there is provided a method of calculating a system matrix for time-of-flight (TOF) list-mode reconstruction of positron-emission tomography (PET) images, the method comprising: (1) determining a TOF geometric projection matrix G; (2) estimating an image-blurring matrix R in image space; (3) obtaining a diagonal matrix $D = \mathrm{diag}\{n_{TOF}\}$ that includes TOF-based normalization factors stored in the vector $n_{TOF}$; and (4) calculating the system matrix H as H=DGR. Note that the object-based attenuation effect depends only on the LOR location and could be included in the D matrix. But in this embodiment, we will include it in the geometric projection matrix G instead of D. Thus we have H=DP, and P=GR.

In another embodiment, the estimating step comprises estimating R as R=AM, wherein $r_j$ is a $j^{th}$ blurring kernel at voxel j and a $j^{th}$ column of R, A is an analytic blurring matrix and is defined as A={$\alpha_j$} with $$\hat{\alpha}_j = \underset{\alpha_j \geq 0}{\mathrm{argmax}} \Phi\bigl(\overline{P}_{non\text{-}TOF} e_j,\ G_{non\text{-}TOF} \alpha_j\bigr)$$

$P_{non\text{-}TOF}$ is an analytically calculated non-TOF system matrix, $e_j$ is a $j^{th}$ unit vector, $G_{non\text{-}TOF}$ is a non-TOF geometric projection matrix, and $\Phi$ is the Poisson log-likelihood function, and M is a measurement-based blurring matrix.

In another embodiment, the method further includes calculating the matrix M by computing $$\hat{x}_j = \underset{x_j \geq 0}{\mathrm{argmax}} \Phi\bigl(y_j,\ \mathrm{diag}\{n_{non\text{-}TOF}\} \overline{P}_{non\text{-}TOF} x_j\bigr).$$

for a given point source scan data $y_j$, wherein $x_j$ is the reconstructed point source kernel image, $\mathrm{diag}\{n_{non\text{-}TOF}\}$ is a diagonal matrix whose diagonal components contain non-TOF-based normalization factors stored in a vector $n_{non\text{-}TOF}$.

In another embodiment, the step of calculating the matrix M comprises: (1) fitting the reconstructed point source kernel image to a parametric model to obtain a parameter set; (2) repeating the computing and fitting steps for a plurality of point sources to obtain a corresponding plurality of parameter sets; and (3) performing interpolation, using the parameter sets, to obtain kernel images at each voxel j, and using the obtained kernel images to form the matrix M.

In another embodiment, the estimating step comprises (1) estimating $r_j$, wherein $r_j$ is a $j^{th}$ blurring kernel image at voxel j and a $j^{th}$ column of R, by reconstructing point source scan data using a non-TOF ordered-subset expectation-maximization (OS-EM) algorithm with a system matrix $H_m = D_m G_{nonTOF}$, wherein $D_m$ includes detector normalization factors; (2) fitting a parametric model to the estimated blurring kernel image $r_j$ using least-squares estimation to obtain a parameter set $p_j$; (3) repeating the estimating and fitting steps for a plurality of point source voxels to obtain a corresponding plurality of parameter sets; and (4) performing interpolation, using the obtained parameter sets, to obtain kernel images at each voxel j, and using the obtained kernel images to form the matrix R.

In another embodiment, the parametric model is $$f(r,t,z|c,\mu_r,\sigma_{r1},\sigma_{r2},\mu_t,\sigma_t,\mu_z,\sigma_z) = c\phi(r|\mu_r,\sigma_{r1},\sigma_{r2})\psi(t|\mu_t,\sigma_t)\gamma(z|\mu_z,\sigma_z)$$

wherein c is a scaling factor indicating a global amplitude of the blurring kernel, $\phi(r|\mu_r, \sigma_{r1}, \sigma_{r2})$ is a radial blur function, which is parameterized as an asymmetric Gaussian with mean $\mu_r$, left and right standard deviation $\sigma_{r1}$ and $\sigma_{r2}$, $\psi(t|\mu_t, \sigma_t)$ is a tangential blur function, which is parameterized as a Gaussian with mean $\mu_t$ and standard deviation $\sigma_t$, and $\gamma(z|\mu_z, \sigma_z)$ is an axial blur function with mean $\mu_z$ and standard deviation $\sigma_z$.

Further, in another embodiment, there is provided an apparatus for calculating a system matrix for time-of-flight (TOF) list-mode reconstruction of positron-emission tomography (PET) images, the apparatus comprising a processor configured to determine a TOF geometric projection matrix G; estimate an image-blurring matrix R in image space; obtain a diagonal matrix D that includes TOF-based normalization factors; and calculate the system matrix H as H=DGR.

Ideally, if inter-crystal scatter effect, photon non-collinearity, and position range effects are negligible, the accurate TOF system matrix can be calculated analytically. For TOF PET, the probability of a photon emitted from voxel j and detected by crystal pair i with time difference $\Delta\tau$ is obtained as follows:

$$p_{ij}(\Delta\tau) \approx a_o^i \kappa_\sigma\bigl(\|\vec{w}_{\Delta\tau}^i - \vec{u}_j\|\bigr) \tag{1}$$

$$\iiint_{V_0} \iiint_{V_1} \int_{L(\vec{v}_0,\vec{v}_1)} \frac{a_d^i(\vec{v}_0,\vec{v}_1)}{\|\vec{v}_1 - \vec{v}_0\|^2} b_j(\ell)\,d\ell\,d\vec{v}_0\,d\vec{v}_1$$

where $a_o^i$ accounts for the object attenuation effect for the ith LOR not considering detector crystal and geometric efficiency effect; $\kappa_\sigma$ is the timing window function. Here, the timing window function is modeled with a Gaussian function whose standard deviation is equal to σ. $\vec{w}^i_{\Delta\tau}$ and $\vec{u}_j$ are the spatial coordinates of the timing window center and voxel j respectively. ∥•∥ is the standard Euclidean distance. $V_0$ and $V_1$ denote the volumetric regions of the two crystals forming the LOR i. $\vec{v}_0$ and $\vec{v}_1$ are sample points inside these two crystals respectively. $d_a$ accounts for the attenuation on the detector side due to the photon penetration which is the function of $\vec{v}_0$ and $\vec{v}_1$. $b_j(•)$ is the basis of function of voxel j and $L(\vec{v}_0, \vec{v}_1)$ is the line defined by $\vec{v}_0$ and $\vec{v}_1$. Notice that if there is no timing window function, Eq. (1) reduces to the probability for the non-TOF case. Therefore, a TOF LOR is roughly equal to a non-TOF LOR weighted by a timing window function. Also, note that to implement the corresponding TOF projector, non-TOF LORs can be precomputed, while the timing window function can be computed on-the-fly.

Accurate TOF LOR can be stored row-by-row to form an accurate system matrix denoted by $P_{TOF}$. In this embodiment, $P_{TOF}$ is decomposed in the form:

$$P_{TOF} = G_{TOF} R \quad (2)$$

where $G_{TOF}$ is the TOF geometrical projection matrix; and R is the image blurring matrix. The factorization may be done in a completely "blind" way that assumes all factors are unknown, but for simplicity $G_{TOF}$ is often given, and then R is estimated. For fast reconstruction, $G_{TOF}$ is modeled using a line integral model.

Figure 1A:
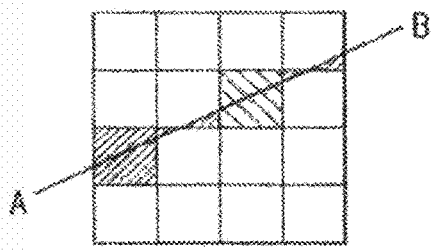
FIG. 1(a) is a 2D illustration of the Siddon's raytracer that goes from A to B passing through an image of size 4×4.

To accelerate the projection speed, the LOR in $G_{TOF}$ may be calculated simply by a line integral rather than a volume integral:

$$g_{ij}(\Delta\tau) \kappa_\sigma(\|\vec{w}^i_{\Delta\tau} - \vec{u}_j\|) \int_{L_i} b_j(l) dl \quad (3)$$

where $L_i$ is a line connecting crystal pair i. We consider the commonly used cubic voxel and evaluate the integral using the intersection length between the line and voxel. This is illustrated in FIG. 1(a). Calculating nonzero voxels can be done efficiently with the Siddon's method or its variants. However, for a fast approximation, the integral is not necessary to be the exact intersection length.

Figure 1B:
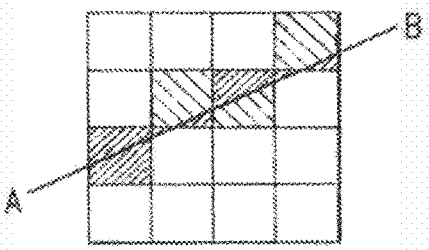
FIG. 1(b) shows how Bresenham's method generates a line from A to B.

In one embodiment, another line projector based on Bresenham's method is used. A 2D example is shown in FIG. 1(b) and its extension to 3D is straightforward. As shown in FIG. 1(b), Bresenham's method requires fewer nonzeros compared to Siddon's method. Also, the number of nonzeros form the minimal requirement for a raytracer to produce a "unbroken" digital line and is equal to the number of image splits, but is not greater than the image largest dimension. This indicates that Bresenham's raytracer could yield the fastest projection speed.

In particular, FIG. 1(a) is a 2D illustration of Siddon's raytracer, which goes from A to B passing through an image of size 4×4. The gray pixels indicate nonzero voxels along the line. The gray level is proportional to the intersection length of line AB with the voxel, i.e., the darker the color is, the longer the length would be. FIG. 1(b) shows how Bresenham's method generates a line from A to B. First, the image is split according to the slope of line AB. In the 2D case, the image can be split into columns or rows depending on the line slope k. If |k|<1, the image is then split into columns, otherwise it is split into rows. In this example, the image is split into 4 columns. Each column can be viewed as a line segment that passes through the voxel center (as shown by the dashed line). The intersection points of line AB with these line segments is computed analytically. A voxel of each column that is nearest to the intersection point is picked up and assigned a value. Here the value is computed as the inverse of the cosine of the angle between line AB and the horizontal axial. All these voxels have the same value as they are in the same color.

Let $r_j$ be the blurring kernel at voxel j. In one embodiment, $r_j$ is estimated by solving $$\hat{r}_j = \underset{r_j \geq 0}{\mathrm{argmax}} \Phi(P_{TOF} e_j, G_{TOF} r_j) \quad (4)$$

where Φ is the Poisson log-likelihood function and $e_j$ is the jth unit vector (or the point source at voxel j). The size of the TOF system matrix can be huge when a small timing bin size is used. However, since TOF does not affect PET spatial resolution, the non-TOF system matrix can be used to perform the estimation as follows:

$$\hat{r}_j = \underset{r_j \geq 0}{\mathrm{argmax}} \Phi(P_{nonTOF} e_j, G_{nonTOF} r_j) \quad (5)$$

To form a complete R requires point source scans at every voxel location, which can be impractical. Alternatively, two small-size matrices, a transaxial image blurring matrix and an axial image blurring matrix, can be estimated. Geometrical symmetry can be used to reduce the amount of point source acquisition and kernel estimation.

Note that since the Poisson log-likelihood function is convex in $r_j$, there exists a unique $\hat{r}_T$, that maximizes the objective function. However, this does not mean that the factorization model itself is exact. A factor that affects the accuracy of the factorization is the choice of $G_{TOF}$. For a linear model in (2), in theory if the range of $P_{TOF}$ is inside the range of $G_{TOF}$, i.e., the column of $P_{TOF}$ belongs to the column space of $G_{TOF}$ (ignoring the normalization matrix because it can be absorbed into $G_{TOF}$), then the factorization can be exact. In most cases, this range condition is not true, especially, when $G_{TOF}$ is computed by a simple line-integral model.

Once the blurring matrix is obtained, additional correction is used to estimate the normalization factor $D = \mathrm{diag}\{n_{TOF}\}$. This can be done with a cylinder source scan. More specifically, two cylinder projections are produced by using the accurate model and the factorization model. The ratio of these two scans is taken as the normalization vector $n_{TOF}$. Additional factors such as crystal efficiency, timing window-dependent correction, and object attenuation factor can also be lumped into this normalization vector. Finally, since the factorization might not be exact, the sensitivity map in ordered-subset (OS) expectation-maximization (EM) reconstruction algorithm should be calculated based on the factored model itself, i.e., backprojecting the factorized system matrix with one count in all possible projection bin locations into an image, $R^T G_{TOF}^T n_{TOF}$ where the superscript T denotes the matrix transpose.

A simulation study was performed to test the method described above. The results of the study indicate that the factorized model gives very similar image resolution and lesion contrast recovery and background noise as the accurate system matrix model. Further, other matrix factorizations are possible. As long as the factorized blur matrix is modeled correctly with its corresponding geometric matrix, different geometric projection matrices give very similar results, which indicate that a simpler geometric projection matrix can be used to accelerate the image reconstruction.

In one embodiment, a listmode-based TOF PET image reconstruction method using a factorized system model was studied. In one embodiment, the factored model primarily contains a geometrical projection matrix and an image blurring matrix, and is therefore suited to listmode data processing because there is no need for the detector response. For fast computing, the factored model allows one to use a simple geometrical projection matrix and calculate it on-the-fly. The image blurring matrix needs to be estimated based on the chosen geometrical projection matrix. In the simulation study, the factorization model was compared to the accurate model. Quantitative analysis reveals that the performance of the factorized model is comparable to the accurate one in terms of the spatial resolution and the noise properties, while its reconstruction speed can be an order of magnitude faster than that based on the accurate model. The results also show that Siddon's method is not the only choice for on-the-fly calculation of the geometrical projection. Bresenham's method can even be faster, and its performance is totally comparable to Siddon's method once the corresponding image blurring matrix is estimated. The efficiency of factored model was investigated by varying the image sampling rate. It was found that, for better contrast recovery, a smaller voxel size should be used. Further, the model accuracy can be improved when a smaller voxel size is used. However, the reconstruction will be more sensitivity to noise if the voxel size is smaller, leading to a higher background variability. Thus, a tradeoff between model accuracy and image quality must be made.

In one embodiment, the estimation of the image blurring matrix requires multiple point source measurements and simulated point source scans based on the analytical calculated system matrix are used. This analytical image blurring kernel can be estimated for every voxel location independently and can compensate for the blurring effect caused by crystal penetration and finite crystal width. It can also compensate for spatially variant sampling artifacts caused by the simple line integral model, because spatial smoothness or rotational symmetry is not assumed. However, it does not model the blurring effect caused by inter-crystal scatter and crystal mis-positioning caused by electronic noise.

In another embodiment, the TOF system matrix is again denoted $P_{TOF}$. Similar to Equation (2) above, $H=DP_{TOF}$ is again decomposed into the form $P_{TOF}=G_{TOF}R$, where $D=\text{diag}\{n_{TOF}\}$ is the diagonal matrix whose diagonal contains TOF-based normalization factors stored in the vector $n_{TOF}$; $G_{TOF}$ is the TOF geometrical projection matrix; and R is the image blurring matrix. $G_{TOF}$ is determined first and then R and the associated normalization matrix are estimated. For fast reconstruction, $G_{TOF}$ is modeled using the line integral model.

Here, H is an M×N system matrix, with its element $h_{ji}$ indicating the possibility that an event emitted in an image voxel i gets detected at crystal pair j, and i=1 . . . N, j= 1 . . . M. $G_{TOF}$ is an M×N matrix indicating the probability of photon detection due to scanner and object geometry, such as the ASV algorithm. $G_{TOF}$ also includes a TOF blur kernel for TOF reconstruction. D is an M×M diagonal matrix that can be used to include detector normalization factors. R is an N×N band matrix, which represents the image-space PSF blur kernel.

For the image-space resolution model, let $r_j$ be the jth blurring kernel at voxel j as well as the ith column of R. By assuming that the timing window is shift invariant, non-TOF point source measurements $y_j$ are used to estimate $r_j$ as:

$$\hat{r}_j = \underset{r_j \geq 0}{\text{argmax}} \Phi\left(y_j, \text{diag}\{n_{non\text{-}TOF}\} G_{non\text{-}TOF} r_j\right) \quad (6)$$

where $\Phi$ is the Poisson log-likelihood function. Note that, in (6), since real point source measurement is used, $\text{diag}\{n_{nonTOF}\}$ is included to model the detector normalization effect.

In practice, to form a complete R, point source scans at every voxel location are required, which can be impractical to obtain.

FIG. 3 illustrates a method to compute the system matrix H in this embodiment.

In step 300, the diagonal matrix $D=\text{diag}\{n_{TOF}\}$ is computed, as described above.

In step 310, the TOF geometrical projection matrix $G_{TOF}$ is computed.

In step 320, rather than estimate R directly from real point source scans, an analytical blurring matrix $A \overset{\Delta}{=} \{\alpha_j\}$ is first estimated using an analytically calculated system matrix, $$\hat{\alpha}_j = \underset{\alpha_j \geq 0}{\text{argmax}} \Phi\left(\overline{P}_{non\text{-}TOF} e_j, G_{non\text{-}TOF} \alpha_j\right) \quad (7)$$

where $P_{non\text{-}TOF}$ is the analytically calculated accurate system matrix, and $e_j$ is the jth unit vector. With a pre-computed P non-TOF, blurring kernels are estimated for all voxel locations. Ideally, one would use $P_{TOF}$ to obtain the image blurring kernels. However, the size of $P_{TOF}$ can be huge when a small timing bin size is used. Since TOF does not affect PET spatial resolution, the non-TOF system matrix is used here to reduce computation and storage cost.

In step 330, the second blurring kernel is estimated based on real point source scans. Given a point source scan data $y_j$, the point source is reconstructed using $$\hat{x}_j = \underset{x_j \geq 0}{\text{argmax}} \Phi\left(y_j, \text{diag}\{n_{non\text{-}TOF}\} \overline{P}_{non\text{-}TOF} x_j\right). \quad (8)$$

The obtained kernel image is then fitted to a parametric model. The whole field of view is sampled using a few point sources and for each point source reconstruction a set of parameters is obtained. By assuming that kernel parameters vary smoothly over the spatial domain, the kernel is obtained at any spatial location through interpolation. These kernels form the measurement-based blurring matrix denoted by M.

In step 340, the blurring matrix R is generated as $$R = AM. \quad (9)$$

In step 350, the system matrix H is determined as $DG_{TOF}R$

The performance of this TOF reconstruction method was evaluated using a GATE-based Monte Carlo simulation. A Toshiba TOF PET scanner having 40 detector blocks and a field of view of 600 mm in diameter was simulated. Prompts were generated and converted to TOF listmode data. The timing resolution was 450 ps and the timing bin size was 16 ps. The image reconstruction was based on true TOF events only.

In order to estimate the image blurring matrix, an analytical accurate system matrix was pre-computed using a known method. The geometrical projection matrix was also precomputed, and the blurring matrix A was then estimated. Eleven point source scans were simulated in GATE to estimate the measurement-based blurring matrix M. M was restricted to transverse in-plane blurring only. Each reconstructed point source was fitted to a 2D Gaussian function. The whole M was obtained by interpolation assuming rotational invariance. Note that the full resolution model R is the product of A and M which is not rotationally invariant.

An analytic IEC phantom was used for quantitative study in which a total of 220 million true TOF events were acquired. The data were reconstructed using an ordered-subsets listmode EM algorithm with 20 subsets. FIGS. 2(a)-2(c) show reconstructed images with (a) no resolution model, (b) an analytical model, and (c) a full resolution model, respectively. Clearly, the resolution model is able to improve the image quality by suppressing the noise effect. Visually, the full resolution model combining A and M yields the best result.

A quantitative comparison was conducted by evaluating the contrast recovery versus the background variability for each sphere. As expected, TOF outperforms non-TOF by reducing the background variability while maintaining the same contrast recovery coefficient. The inclusion of the resolution model is essential for higher contrast recovery. By using the measurement-based blurring kernel, the contrast can be further improved.

In this embodiment, a hybrid image space resolution model for listmode-based TOF PET image reconstruction is described. The results indicate that the hybrid model can be an efficient way of modeling image domain blurring effects based on a small number of point source scans. Further, fast reconstruction can be achieved with GPU acceleration.

In another embodiment, estimation of the R matrix is performed through measuring a point source at different positions in the imaging FOV.

FIG. 4 illustrates a method to compute the system matrix H in this embodiment.

In step 400, the diagonal matrix $D=\text{diag}\{n_{TOF}\}$ is computed, as described above.

In step 410, the TOF geometrical projection matrix $G_{TOF}$ is computed.

In step 420, for a given pixel location i, the i-th column of the R matrix is a blurred 3D image centered around pixel i, and is called a PSF image. This PSF image is estimated by reconstructing the measured point source using a non-TOF OS-EM algorithm with system matrix $H_m = D_m G_{nonTOF}$, where the $D_m$ matrix only has detector normalization factor. Random correction is also performed for the point source reconstruction, but scatter correction is not needed.

In step 430, to remove statistical noise, the estimated PSF image is parameterized with three separable 1D functions in image radial, tangential and axial directions, respectively, as shown below:

$$f(r,t,z|c,\mu_r,\sigma_{r1},\sigma_{r2},\mu_t,\sigma_t,\mu_z,\sigma_z) = c\phi(r|\mu_r,\sigma_{r1},\sigma_{r2})\psi(t|\mu_t,\sigma_t)\gamma(z|\mu_z,\sigma_z)$$

wherein c is a scaling factor indicating a global amplitude of the blurring kernel. $\phi(r|\mu_r, \sigma_{r1}, \sigma_{r2})$ is a radial blur function, which is parameterized as an asymmetric Gaussian with mean $\mu_r$, left and right standard deviation $\sigma_{r1}$ and $\sigma_{r2}$. $\psi(t|\mu_t, \sigma_t)$ is a tangential blur function, which is parameterized as a Gaussian with mean $\mu_t$ and standard deviation $\sigma_t$, and $\gamma(z|\mu_z, \sigma_z)$ is an axial blur function with mean $\mu_z$ and standard deviation $\sigma_z$. Note that, in general, the parameterized PSF kernel functions do not need to be Gaussian, but can be any function that matches the estimated PSF image. For example, polynomial or a summation of exponential functions can be used The parameter fitting is performed on the estimated PSF image for a given point source location using a least-square (LS) estimation, for example.

The number of iterations of the OS-EM algorithm will affect the shape and noise properties of the estimated PSF image, and thus affect the parameters of the PSF image. Enough point source measurement counts may be needed, optimal number of iterations and subsets may also be needed for OS-EM, or post-smoothing may be needed for these PSF parameters.

In step 440, the above-described estimating and fitting steps (420 and 430) are repeated for a plurality of point source voxels to obtain a corresponding plurality of parameter sets $p_j$.

In step 450, interpolation is performed, using the obtained parameter sets, to obtain kernel images at each voxel j, and the obtained kernel images are used as column vectors to form the matrix R.

Ideally, the R matrix is needed at every image pixel location within the whole imaging FOV, but practically, one can reduce the imaging FOV transversely to a wedge of a circle (where the wedge angle=360°/# of modules) or even a radial line, and extend only half of the scanner axial length by using scanner geometric symmetry. Also, the pixel distance is comparable to the minimum pixel size supported in image reconstruction. Alternatively, the latter requirement can be relaxed and interpolation can be used for those points where PSF measurements are not performed directly.

In step 460, the system matrix H is determined as $DG_{TOF}R$.

When the parameterized R matrix is calculated, PSF TOF-ASV-LM-OSEM reconstruction is performed as follows: (1) obtain an initial estimate of the emission image; and (2) compute the OS-EM sensitivity image using the R matrix. Then, at each iteration: (a) smooth the emission image with space-variant R matrix; (b) perform regular TOF-ASV-LM-OSEM forward and back-projection, and get the correction image; (c) smooth the correction image with $R^T$; (d) update the emission image with the smoothed correction image and sensitivity image; and (e) repeat (a)-(d) for a preset number of iterations.

The above-described embodiments provide several advantages over conventional approaches. First, the spatial resolution and lesion contrast recovery of the reconstructed image is improved. Further, the disclosed embodiments are designed to be more suitable for list-mode PET reconstruction as compared to sinogram or projection space reconstruction. In particular, the disclosed embodiments do not require finding neighboring projection bins, which are likely not readily available for list-mode reconstruction.

FIG. 5 shows an exemplary PET hardware configuration that can be used with the present embodiments. In FIG. 5, photomultiplier tubes 135 and 140 are arranged over light guide 130, and the array of scintillation crystals 105 is arranged beneath the light guide 130. A second array of scintillation crystals 125 is disposed opposite the scintillation crystals 105 with light guide 115 and photomultiplier tubes 195 and 110 arranged thereover.

In FIG. 5, when gamma rays are emitted from a body under test, the gamma rays travel in opposite directions, approximately 180° from each other. Gamma ray detection occurs simultaneously at scintillation crystals 100 and 120, and a scintillation event is determined when the gamma rays are detected at scintillation crystals 100 and 120 within a predefined time limit. Thus, the gamma ray timing detection system detects gamma rays simultaneously at scintillation crystals 100 and 120. However, for simplicity only, gamma ray detection is described relative to scintillation crystal 100. One of ordinary skill in the art will recognize, however, that the description given herein with respect to scintillation crystal 100 is equally applicable to gamma ray detection at scintillation crystal 120.

Each photomultiplier tube 110, 135, 140 and 195 is respectively connected to data acquisition unit 150. The data acquisition unit 150 includes hardware configured to process the signals from the photomultiplier tubes. The data acquisition unit 150 measures the arrival time of the gamma ray. The data acquisition unit 150 produces two outputs (one for the combination of PMT 135/140 and one for the combination of PMT 110/195) which encodes the time of the discriminator pulse relative to a system clock (not shown). For a time-of-flight PET system, the data acquisition unit 150 typically produces a time stamp with an accuracy of 15 to 25 ps. The data acquisition unit measures the amplitude of the signal on each PMT (four of the outputs from data acquisition unit 150).

The data acquisition unit outputs are provided to a CPU 170 for processing. The processing consists of estimating an energy and position from the data acquisition unit outputs and an arrival time from the time stamps output for each event, and may include the application of many correction steps, based on prior calibrations, to improve the accuracy of the energy, position, and time estimates.

Moreover, the CPU 170 is configured to perform PET image reconstruction, including performing the methods for calculating a system matrix for time-of-flight (TOF) list-mode reconstruction estimating random events according to the flowcharts shown in FIGS. 3 and 4 and described above.

As one of ordinary skill in the art would recognize, the CPU 170 can be implemented as discrete logic gates, as an Application Specific Integrated Circuit (ASIC), a Field Programmable Gate Array (FPGA) or other Complex Programmable Logic Device (CPLD). An FPGA or CPLD implementation may be coded in VHDL, Verilog or any other hardware description language and the code may be stored in an electronic memory directly within the FPGA or CPLD, or as a separate electronic memory. Further, the electronic memory may be non-volatile, such as ROM, EPROM, EEPROM or FLASH memory. The electronic memory may also be volatile, such as static or dynamic RAM, and a processor, such as a microcontroller or microprocessor, may be provided to manage the electronic memory as well as the interaction between the FPGA or CPLD and the electronic memory.

Alternatively, the CPU 170 may be implemented as a set of computer-readable instructions stored in any of the above-described electronic memories and/or a hard disc drive, CD, DVD, FLASH drive or any other known storage media. Further, the computer-readable instructions may be provided as a utility application, background daemon, or component of an operating system, or combination thereof, executing in conjunction with a processor, such as a Xeon processor from Intel of America or an Opteron processor from AMD of America and an operating system, such as Microsoft VISTA, UNIX, Solaris, LINUX, Apple, MAC-OS and other operating systems known to those skilled in the art.

Once processed by the CPU 170, the processed signals are stored in electronic storage 180, and/or displayed on display 145. As one of ordinary skill in the art would recognize, electronic storage 180 may be a hard disk drive, CD-ROM drive, DVD drive, FLASH drive, RAM, ROM or any other electronic storage known in the art. Display 145 may be implemented as an LCD display, CRT display, plasma display, OLED, LED or any other display known in the art. As such, the descriptions of the electronic storage 180 and the display 145 provided herein are merely exemplary and in no way limit the scope of the present advancements.

FIG. 5 also includes an interface 175 through which the gamma ray detection system interfaces with other external devices and/or a user. For example, interface 175 may be a USB interface, PCMCIA interface, Ethernet interface or any other interface known in the art. Interface 175 may also be wired or wireless and may include a keyboard and/or mouse or other human interface devices known in the art for interacting with a user.

While certain embodiments have been described, these embodiments have been presented by way of example only, and are not intended to limit the scope of the inventions. Indeed, the novel methods and systems described herein may be embodied in a variety of other forms. Furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A method of performing time-of-flight (TOF) list-mode reconstruction of a positron-emission tomography (PET) image, the method comprising:
detecting gamma rays by a PET detector;
generating count data based on the detected gamma rays;
determining a TOF geometric projection matrix G including effects of object attenuation;
estimating an image-blurring matrix R in image space;
obtaining a diagonal matrix D that includes TOF-based normalization factors;
calculating a system matrix H as H=DGR; and
reconstructing the PET image from the count data using the calculated system matrix.

2. The method of claim 1, wherein the estimating step comprises:
estimating R as R=AM,
wherein $r_j$ is a $j^{th}$ blurring kernel at voxel j and a $j^{th}$ column of R, A is an analytic blurring matrix and is defined as A={$\alpha_j$} with $$\hat{\alpha}_j = \underset{\alpha_j \geq 0}{\mathrm{argmax}} \Phi(\overline{P}_{non\text{-}TOF} e_j, G_{non\text{-}TOF} \alpha_j)$$

$P_{non\text{-}TOF}$ is an analytically calculated non-TOF system matrix, $e_j$ is a $j^{th}$ unit vector, $G_{non\text{-}TOF}$ is a non-TOF geometric projection matrix, and $\Phi$ is the Poisson log-likelihood function; and
M is a measurement-based blurring matrix.

3. The method of claim 2, further comprising calculating the matrix M by computing $$\hat{x}_j = \underset{x_j \geq 0}{\mathrm{argmax}} \Phi(y_j, \mathrm{diag}\{n_{non\text{-}TOF}\} \overline{P}_{non\text{-}TOF} x_j).$$

for a given point source scan data $y_j$, wherein $x_j$ is the reconstructed point source kernel image, diag{$n_{non\text{-}TOF}$} is a diagonal matrix whose diagonal components contain non-TOF-based normalization factors stored in a vector $n_{non-TOF}$.

4. The method of claim 3, wherein the step of calculating the matrix M comprises:
   fitting the reconstructed point source kernel image to a parametric model to obtain a parameter set;
   repeating the computing and fitting steps for a plurality of point sources to obtain a corresponding plurality of parameter sets; and
   performing interpolation, using the parameter sets, to obtain kernel images at each voxel j, and using the obtained kernel images to form the matrix M.

5. The method of claim 1, wherein the estimating step comprises:
   estimating $r_j$, wherein $r_j$ is a $j^{th}$ blurring kernel image at voxel j and a $j^{th}$ column of R, by reconstructing point source scan data using a non-TOE ordered-subset expectation-maximization (OS-EM) algorithm with a system matrix $H_m = D_m G_{nonTOF}$, wherein $D_m$ includes detector normalization factors;
   fitting a parametric model to the estimated blurring kernel image $r_j$ using least-squares estimation to obtain a parameter set $p_j$;
   repeating the estimating and fitting steps for a plurality of point source voxels to obtain a corresponding plurality of parameter sets; and
   performing interpolation, using the obtained parameter sets, to obtain kernel images at each voxel j, and using the obtained kernel images to form the matrix R.

6. The method of claim 5, wherein the parametric model is $$f(r,t,z|c,\mu_r,\sigma_{r1},\sigma_{r2},\mu_t,\sigma_t,\mu_z,\sigma_z) = c\phi(r|\mu_r,\sigma_{r1},\sigma_{r2})\psi(t|\mu_t,\sigma_t)\gamma(z|\mu_z,\sigma_z)$$

wherein c is a scaling factor indicating a global amplitude of the blurring kernel, $\phi(r|\mu_r, \sigma_{r1}, \sigma_{r2})$ is a radial blur function, which is parameterized as an asymmetric Gaussian with mean $\mu_r$, left and right standard deviation $\sigma_{r1}$ and $\sigma_{r2}$, $\psi(t|\mu_t, \sigma_t)$ is a tangential blur function, which is parameterized as a Gaussian with mean $\mu_t$ and standard deviation $\sigma_t$, and $\gamma(z|\mu_z, \sigma_z)$ is an axial blur function with mean $\mu_z$ and standard deviation $\sigma_z$.

7. The method of claim 1, further comprising:
   displaying, on a display, the reconstructed PET image.

8. An apparatus for performing time-of-flight (TOP) list-mode reconstruction of a positron-emission tomography (PET) image, the apparatus comprising:
   a PET detector configured to detect gamma rays; and
   a processor configured to
      generate count data based on the detected gamma rays;
      determine a TOF geometric projection matrix G;
      estimate an image-blurring matrix R in image space;
      obtain a diagonal matrix D that includes TOF-based normalization factors;
      calculate a system matrix H as H=DGR; and
      reconstruct the PET image from the count data using the calculated system matrix.

9. The apparatus of claim 8, wherein the estimating step comprises:
   estimating R as R=AM,
   wherein $r_j$ is a $j^{th}$ blurring kernel at voxel j and a $j^{th}$ column of R, A is an analytic blurring matrix and is defined as $A = \{\alpha_j\}$ a $$\hat{\alpha}_j = \underset{\alpha_j \geq 0}{\mathrm{argmax}}\, \Phi(\overline{P}_{non-TOF} e_j, G_{non-TOF}\alpha_j)$$

$P_{non-TOF}$ is an analytically calculated non-TOF system matrix, $e_j$ is a $j^{th}$ unit vector, $G_{non-TOF}$ is a non-TOF geometric projection matrix, and $\Phi$ is the Poisson log-likelihood function; and
M is a measurement-based blurring matrix.

10. The apparatus of claim 9, further comprising calculating the matrix M by computing $$\hat{x}_j = \underset{x_j \geq 0}{\mathrm{argmax}}\, \Phi(y_j, \mathrm{diag}\{n_{non-TOF}\}\overline{P}_{non-TOF}x_j).$$

for a given point source scan data $y_j$, wherein $x_j$ is the reconstructed point source kernel image, $\mathrm{diag}\{n_{non-TOF}\}$ is a diagonal matrix whose diagonal components contain non-TOF-based normalization factors stored in a vector $n_{non-TOF}$.

11. The apparatus of claim 10, wherein the step of calculating the matrix M comprises:
   fitting the reconstructed point source kernel image to a parametric model to obtain a parameter set:
   repeating the computing and fitting steps for a plurality of point sources to obtain a corresponding plurality of parameter sets; and
   performing interpolation, using the parameter sets, to obtain kernel Images at each voxel j, and using the obtained kernel images to form the matrix M.

12. The apparatus of claim 8, wherein the estimating step comprises:
   estimating $r_j$, wherein $r_j$ is a $j^{th}$ blurring kernel image at voxel j and a $j^{th}$ column of R, by reconstructing point source scan data using a non-TOF ordered-subset expectation-maximization (OSEM) algorithm with a system matrix $H_m = D_m G_{nonTOF}$, wherein $D_m$ includes only detector normalization factors;
   fitting a parametric model to the estimated blurring kernel image $r_j$ using least-squares estimation to obtain a parameter set $p_j$;
   repeating the estimating and fitting steps for a plurality of point source voxels to obtain a corresponding plurality of parameter sets; and
   performing interpolation, using the obtained parameter sets, to obtain kernel images at each voxel j, and using the obtained kernel images to form the matrix R.

13. The apparatus of claim 12, wherein the parametric model is $$f(r,t,z|c,\mu_r,\sigma_{r1},\sigma_{r2},\mu_t,\sigma_t,\mu_z,\sigma_z) = c\phi(r|\mu_r,\sigma_{r1},\sigma_{r2})\psi(t|\mu_t,\sigma_t)\gamma(z|\mu_z,\sigma_z)$$

wherein c is a scaling factor indicating a global amplitude of the blurring kernel, $\phi(r|\mu_r, \sigma_{r1}, \sigma_{r2})$ is a radial blur function, which is parameterized as an asymmetric Gaussian with mean $\mu_r$, left and right standard deviation $\sigma_{r1}$ and $\sigma_{r2}$, $\psi(t|\mu_t, \sigma_t)$ is a tangential blur function, which is parameterized as a Gaussian with mean $\mu_t$ and standard deviation $\sigma_t$, and $\gamma(z|\mu_z, \sigma_z)$ is an axial blur function with mean $\mu_z$ and standard deviation $\sigma_z$.

* * * * *